US007246053B2

(12) United States Patent
Soufi et al.

(10) Patent No.: US 7,246,053 B2
(45) Date of Patent: Jul. 17, 2007

(54) METHOD FOR TRANSFORMING BEHAVIORAL ARCHITECTURAL AND VERIFICATION SPECIFICATIONS INTO CYCLE-BASED COMPLIANT SPECIFICATIONS

(75) Inventors: Mohamed Soufi, Santa Clara, CA (US); William K. Lam, Newark, CA (US); Victor A. Chang, Mountain View, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 859 days.

(21) Appl. No.: 10/211,052

(22) Filed: Aug. 2, 2002

(65) Prior Publication Data

US 2004/0025073 A1 Feb. 5, 2004

(51) Int. Cl.
*G06F 17/50* (2006.01)

(52) U.S. Cl. ............................. 703/17; 703/15; 703/16

(58) Field of Classification Search ............. 703/15–17
See application file for complete search history.

(56) References Cited

U.S. PATENT DOCUMENTS

2003/0033039 A1* 2/2003 Gutberlet et al. ............. 700/97

OTHER PUBLICATIONS

Jerry Banks, "Handbook of Simulation Principles, Methodology, Advances, Applications, and Practice", John Wiley & Sons, INC., 1998, p. 15-18.*
Synopsys, "Mixed-HDL Simulation", Jan. 29, 2001.*

* cited by examiner

*Primary Examiner*—Hugh Jones
(74) *Attorney, Agent, or Firm*—Osha Liang LLP

(57) ABSTRACT

A method for transforming a behavioral specification involves converting the behavioral specification into a diagram representation, converting a delay from the diagram representation if the behavioral specification comprises a delay, generating a compliant cycle diagram from the diagram representation, and deriving a cycle equivalent behavioral specification from the compliant cycle diagram.

18 Claims, 9 Drawing Sheets

METHOD FOR TRANSFORMING BEHAVIORAL ARCHITECTURAL AND VERIFICATION SPECIFICATIONS INTO CYCLE-BASED COMPLIANT SPECIFICATIONS

BACKGROUND OF INVENTION

Modern high performance microprocessors have an ever-increasing number of circuit elements and an ever-rising clock frequency. Also, as the number of circuits that can be used in a CPU has increased, the number of parallel operations performed by the circuits has risen. Examples of efforts to create more parallel operations include increased pipeline depth and an increase in the number of functional units in super-scalar and very-long-instruction-word architectures. As CPU performance continues to increase, the result has been a larger number of circuits switching at faster rates. Thus, from a circuit design perspective, important considerations such as the time needed to complete a circuit simulation and the time needed to debug the CPU are taken into account.

As each new CPU design uses more circuits and circuit elements, each often operating at increased frequencies, the time required to simulate the circuit design increases. Due to the increased time for simulation, the number of tests, and consequently the test coverage, may decrease. In general, the result has been a dramatic increase in the logic errors that escape detection before the CPU is manufactured.

After a CPU prototype is initially manufactured and failure modes are uncovered, the time required to determine failure mechanisms is generally increasing due to the increased CPU complexity. Failure modes may be the result of logic errors or poor manufacturability of a circuit. In both cases, circuit simulation helps to confirm or refute the existence of a logic error. Even after a logic error failure mechanism is discovered and a solution is proposed, the time required to satisfactorily determine that the proposed solution fixes the logic error and does not generate any new logic errors has increased. Circuit simulation is key to the design and debugging of increasingly complex and faster CPUs.

Circuit simulation may occur at a "switch-level." Switch-level simulations typically include active circuit elements (e.g., transistors) and passive circuit elements (e.g., resistors, capacitors, and inductors). A typical switch-level circuit simulator is "SPICE," which is an acronym for Simulation Program with Integrated Circuit Emphasis. SPICE typically models each element using an equation or lookup table. SPICE can model accurately the voltage and/or current of each circuit element across time.

Circuit simulation also may occur at a "behavioral level." Behavioral level simulations typically use a hardware description language (HDL) that determines the functionality of a single circuit element or group of circuit elements. A typical behavioral level simulation language is "Verilog," which is an Institute of Electrical and Electronics Engineers standard. Verilog HDL uses a high-level programming language to describe the relationship between the input and output of one or more circuit elements. Verilog HDL describes on what conditions the outputs should be modified and what affect the inputs have. Verilog HDL programs may also be used for logic simulation at the "register transfer level" (RTL). RTL is a programming language used to describe a circuit design. The RTL programs written in Verilog go through a verification process. During this process, the Verilog design is parsed and checked for RTL style conformance by a style checker.

Using the Verilog HDL, for example, digital systems are described as a set of modules. Each module has a port interface, which defines the inputs and outputs for the module. The interface describes how the given module connects to other modules. Modules can represent elements of hardware ranging from simple gates to complete systems. Each module can be described as an interconnection of sub-modules, as a list of terminal elements, or a mixture of both. Terminal elements within a module can be described behaviorally, using traditional procedural programming language constructs such as "if" statements and assignments, and/or structurally as Verilog primitives. Verilog primitives include, for example, truth tables, Boolean gates, logic equation, pass transistors (switches), etc.

HDL languages, such as Verilog, are designed for efficient representation of hardware designs. Verilog has support for handling signals of arbitrary widths, not only for defining and using an arbitrary width signal, but for treating any sub-field of such a signal as a signal in its own right.

HDL simulations, written using HDL languages, may be event driven or cycle-based. Event-driven simulators are designed to eliminate unnecessary gate simulations without introducing an unacceptable amount of additional testing. Event-driven simulators propagate a change in state from one set of circuit elements to another. Event-driven simulators may record relative timing information of the change in state so that timing and functional correctness may be verified. Event-driven simulators use event queues to order and schedule the events. Event-driven simulators process and settle all the active events in a time step before the simulator can move to the next time step.

Cycle-based simulators also simulate a change in state from one set of circuit elements to another; however, the state of an entire system is evaluated once each clock cycle. Cycle-based simulators are applicable to synchronous digital systems and may be used to verify the functional correctness of a digital design. Cycle-based simulators abstract away the timing details for all transactions that do not occur on a cycle boundary. Cycle-based simulators use algorithms that eliminate unnecessary calculations to achieve improved performance in verifying system functionality. Discrete component evaluations and re-evaluations are typically unnecessary upon the occurrence of every event.

Cycle-based simulators typically have enhanced performance. Depending on the particular options used, cycle-based simulators can offer five to ten times improvement in speed and one-fifth to one-third the memory utilization over conventional, event-driven simulators. Some cycle-based simulators also offer very fast compile times. For very large designs, the reduced memory requirements of cycle-based simulators allow a design team to simulate a design on almost every workstation on their network.

Usually a circuit is designed in RTL, whereas a test apparatus for verifying the design is written on a "behavior level." A behavior description of the test apparatus is higher level than RTL and, thus, cycle boundaries are not necessarily well defined. When simulating a circuit design, the circuit described in RTL and the test apparatus described in behavior language are simulated together. Thus, lack of clear cycle boundaries in the test apparatus makes execution of the circuit simulation difficult in cycle-based simulators.

SUMMARY OF INVENTION

In general, in one aspect the invention involves a method for transforming a behavioral specification. The method comprises converting the behavioral specification into a diagram representation, converting a delay from the diagram representation if the behavioral specification comprises a delay, generating a compliant cycle diagram from the diagram representation, and deriving a cycle equivalent behavioral specification from the compliant cycle diagram.

In general, in one aspect the invention involves a computer system to transform a behavioral specification. The computer system comprises a processor, a memory, and software instructions. The software instructions stored in the memory for enabling the computer system under control of the processor to perform converting the behavioral specification into a diagram representation, converting a delay from the diagram representation if the behavioral specification comprises a delay, generating a compliant cycle diagram from the diagram representation, and deriving a cycle equivalent behavioral specification from the compliant cycle diagram.

In general, in one aspect the invention involves a computer-readable medium having recorded thereon a plurality of instructions executable by a processor. The plurality of instructions comprises converting the behavioral specification into a diagram representation, converting a delay from the diagram representation if the behavioral specification comprises a delay, generating a compliant cycle diagram from the diagram representation, and deriving a cycle equivalent behavioral specification from the compliant cycle diagram.

In general, in one aspect the invention involves an apparatus for transforming a behavioral specification. The apparatus comprises means for converting the behavioral specification into a diagram representation, means for converting a delay from the diagram representation if the behavioral specification comprises a delay, means for generating a compliant cycle diagram from the diagram representation, and means for deriving a cycle equivalent behavioral specification from the compliant cycle diagram.

Other aspects and advantages of the invention will be apparent from the following description and the appended claims.

DETAILED DESCRIPTION

Figure 1:
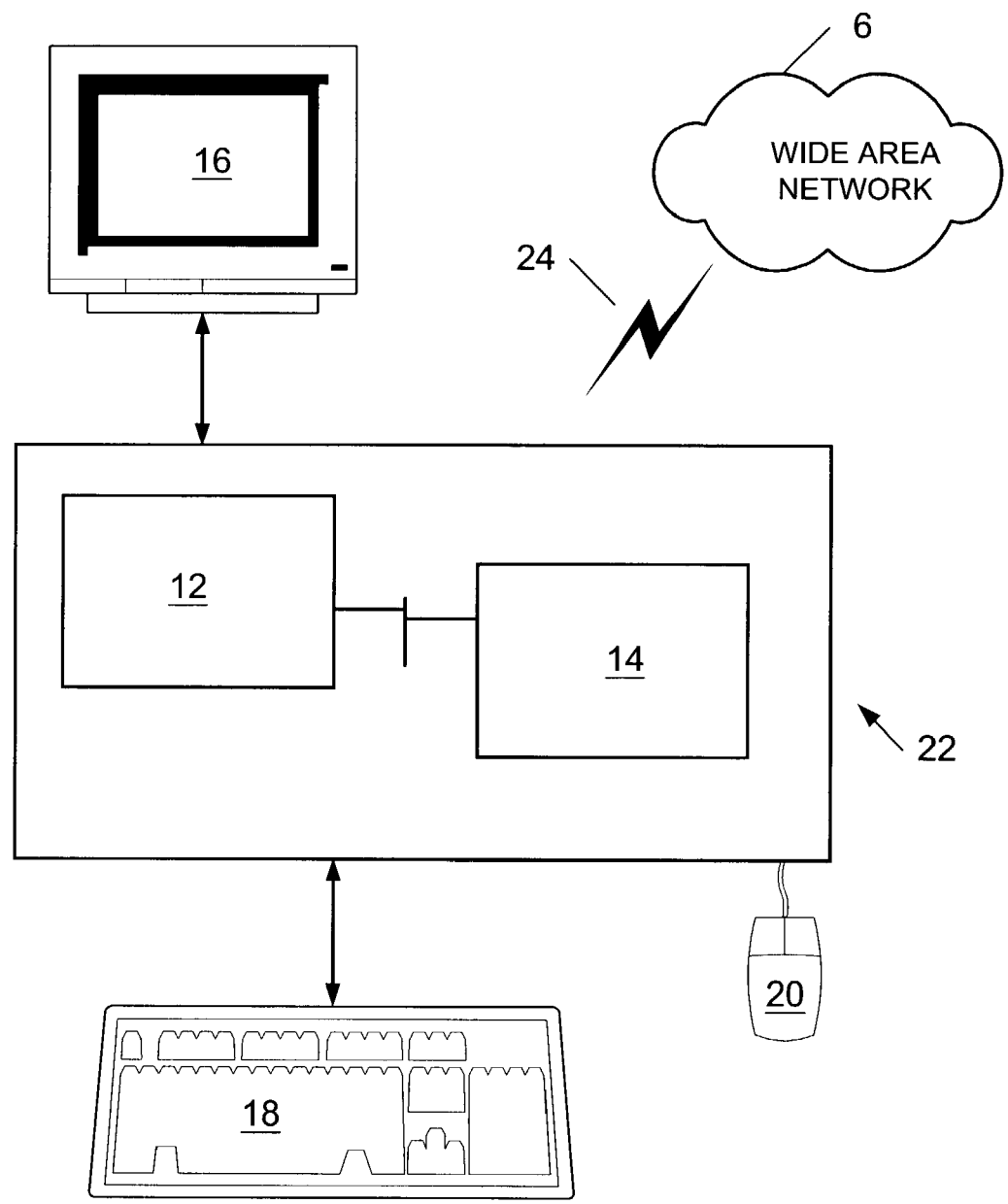
FIG. 1 shows a common networked computer system.

Specific embodiments of the invention will now be described in detail with reference to the accompanying figures. Like elements in the various figures are denoted by like reference numerals for consistency.

In the following detailed description of the invention, numerous specific details are set forth in order to provide a more thorough understanding of the invention. However, it will be apparent to one of ordinary skill in the art that the invention may be practiced without these specific details. In other instances, well-known features have not been described in detail to avoid obscuring the invention.

The invention may be implemented on virtually any type of computer regardless of the platform being used. For example, as shown in FIG. 1, a common computer (22) includes a processor (12), memory (14), a storage device (14), and numerous other elements and functionalities typical of today's computers (not shown). The computer (22) may also include input means, such as a keyboard (18), a mouse (20), and an output device, such as a monitor (16). Those skilled in the art will appreciate that these input and output means may take other forms in an accessible environment. The computer (22) may be connected to a wide area network via a network connection (24). In one or more embodiments of the invention, the computer system may have multiple processors and may be configured to handle multiple tasks.

The invention relates to a method for transforming a behavioral specification describing a test apparatus into a cycle-based compliant circuit design. The behavioral specification describes the test apparatus and may be written in "C" or a similar high level programming language. The test apparatus or test bench instantiates the testing environment, e.g., generating test patterns. In order for circuits to be simulated on the cycle-based simulators, the cycle boundaries of the behavioral specification need to be clearly defined so that the test apparatus (as defined by the behavioral specification) may be simulated together with the circuit design (defined by an RTL description) during the verification phase (as shown in FIG. 2) of preparing a circuit design to run on a cycle-based simulation system.

Figure 2:
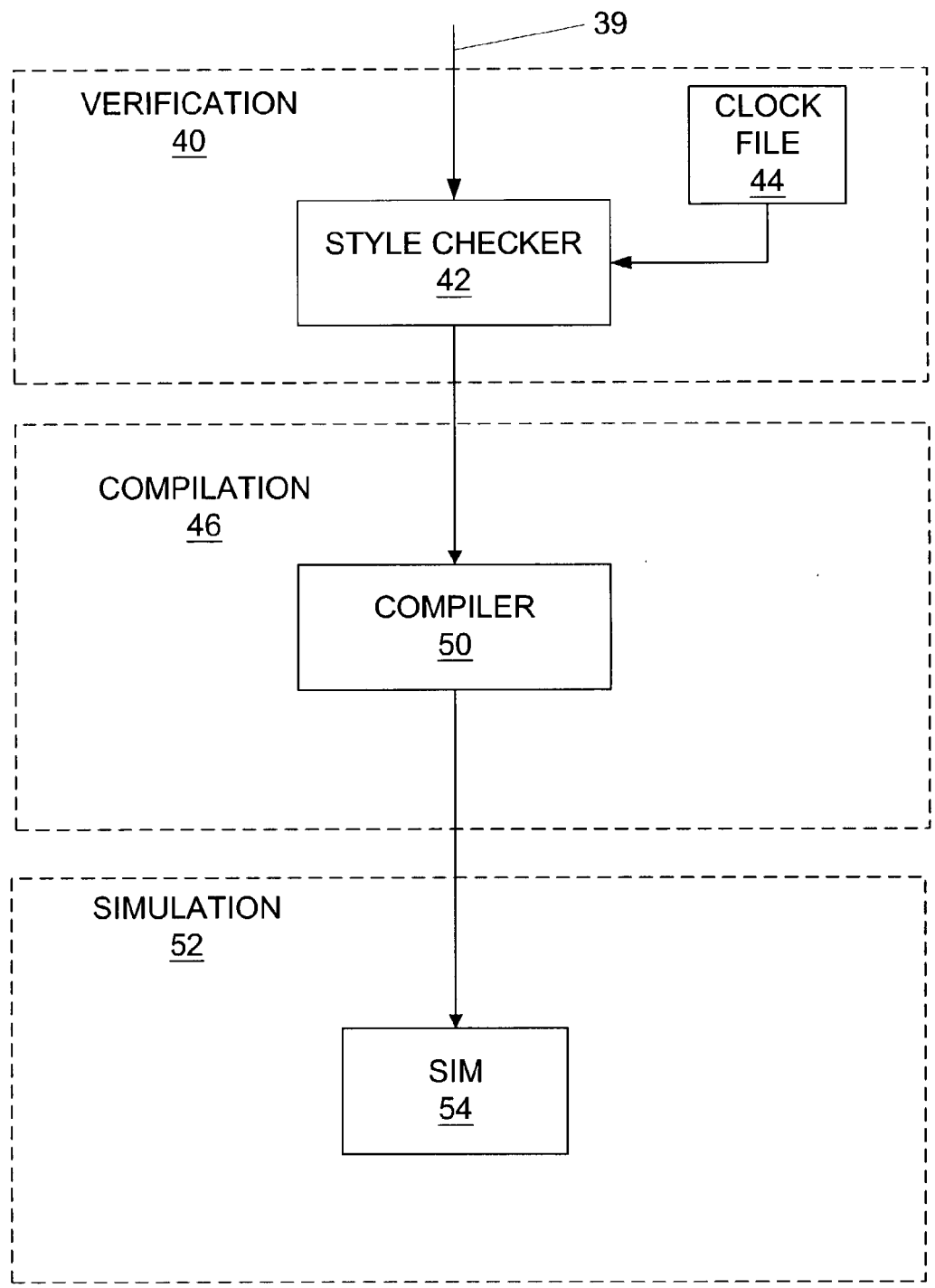
FIG. 2 shows a process of preparing a simulation of a cycle-based logic design to run on a cycle-based simulation system in accordance with one or more embodiments of the invention.

In accordance with one or more embodiments of the invention, FIG. 2 shows a process of preparing a simulation of a cycle-based logic design to run on a cycle-based simulation system. The process includes three separate phases. The first phase is a verification phase (40). This phase includes a style checker (42), which parses and checks high level design code of a program (39), such as a behavioral specification and a circuit design. The behavioral specification and the circuit design are checked for adherence to a cycle-based design standard, e.g., synchronous logic design, no combinatorial logic loops, etc. An error action during this phase results from nonconformance to the defined cycle-based design standards. A clock file input (44)

defines clocks cycles for the simulation. The output of the verification phase (40) produces a verified cycle-based design.

The second phase is a compilation phase (46), which receives the verified cycle-based design as input from the verification phase (40). The compilation phase (46) uses a translation component, such as a compiler (50), to compile the verified cycle-based design of the verification phase (40). The compiler (50) decomposes the verified cycle-based design into execution processor code that may be executed in parallel on a processor array of the cycle-based system by one or more execution processors.

The third phase is the simulation phase (52), which receives input in the form of execution processor code from the compilation phase (46). A simulator (54) (SIM) typically runs the execution processor code on a host computer and controls and monitors execution of simulations executing on the cycle-based system.

In accordance with one or more embodiments of the invention, the behavioral specification that is typically transformed into a cycle-based compliant design during the verification phase (40) may be categorized as a class I or a class II specification. Class I specifications include multiple cycles within a procedural block, while class II specifications include delays embedded in a circuit. One skilled in the art will appreciate that a specification may exist that combines characteristics of class I and class II specifications.

Class I specifications include initial or always blocks. Initial blocks are similar to always blocks, except that initial blocks execute only once, whereas always blocks execute indefinitely. An initial block includes a statement or a group of statements, enclosed in begin . . . end statement pair, which are intended to execute only once at simulation time 0. If there is more than one block, each block executes concurrently and independently. The initial block is normally used for initialization, monitoring, generating waveforms (e.g., clock pulses), and processes that are executed once during a simulation. An always block is similar to the initial block, but the statements inside an always block are repeated continuously in a looping fashion.

Class II specifications include delays indicated by pound statements, e.g., #10. The delays are typically located before a statement or in the middle of an assignment statement. Once all delays are converted, the resulting specification becomes a class I specification and transformed accordingly.

Figure 3:
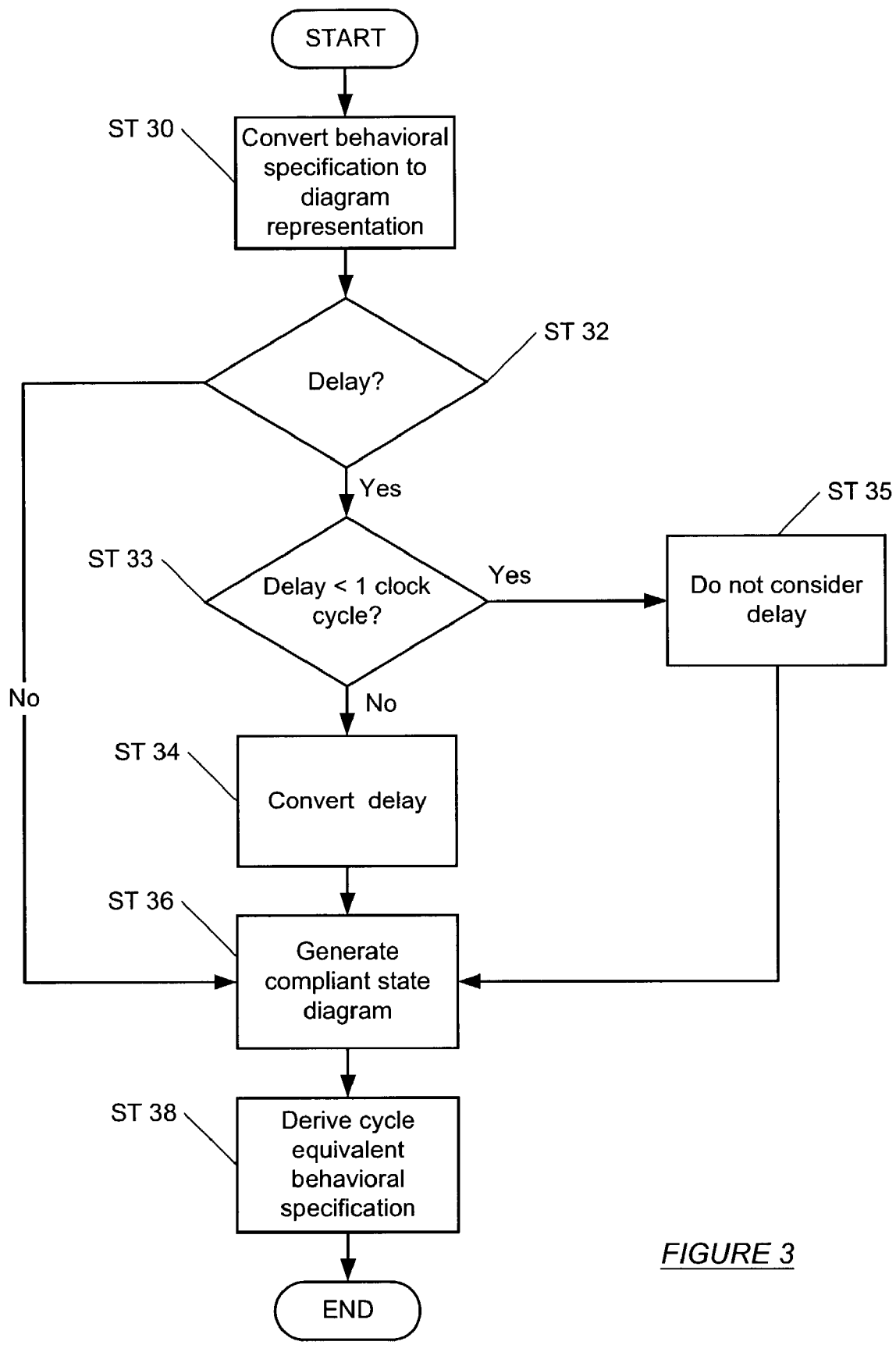
FIG. 3 shows a process used to transform a behavioral specification and a test apparatus description into a cycle-based compliant circuit design in accordance with one or more embodiments of the invention.

In accordance with one or more embodiments of the invention, the process of transforming a behavioral specification (class I or class II) into cycle-based compliant circuit design is shown in FIG. 3. When evaluating a circuit design, a behavioral specification describing the test apparatus is converted to an equivalent diagram representation (Step 30). Each line in the behavioral specification is represented in the diagram representation. Each event statement is represented by a box (or node) that contains an "ox." The "ox" denotes a node numbered "x," e.g., o2 denotes a second node. All conditional (or branching) statements are represented in a decision box. The decision box is represented by a diamond-shaped symbol with true and false branches. The condition placed in the box is a Boolean expression that is evaluated to determine which branch (i.e., true or false) to take. Other statements define connections between nodes. Cycle boundaries are determined by observing the use of the behavioral specification, i.e., "@" statements.

The equivalent diagram representation is examined to determine whether the diagram contains a delay (Step 32). If the diagram contains a delay and if the delay is less than the clock cycle (Step 33), then the delay is not considered (Step 35). Otherwise, if the diagram contains the delay and the delay is greater than or equal to the clock cycle, then the delay is converted (Step 34). In cycle-based simulators, delay is not permissible; thus the delay is removed by converting the delay to clock cycles. The number of delays present in the diagram is taken into account relative to all available clocks in order to determine how many clock cycles are equivalent to a particular delay. In general, the delay can be transformed into a number of clock cycles and the number of cycles is determined using the formula below:

$$N=2*[sumd(0{:}i{+}1)/clk\_gcd]-2*[sumd(0{:}i)/clk\_gcd]$$

Note: sum starts from the last clock edge and clk_gcd is the greatest common divisor of all clock periods.

A compliant cycle diagram is generated from the equivalent diagram representation (Step 36). The compliant cycle diagram has cycle boundaries with states that are clearly defined. Each state represents a state of the circuit at a cycle boundary.

Finally, a cycle equivalent behavioral specification is derived from the compliant cycle diagram (Step 38). Using the original behavioral specification in conjunction with the complaint cycle diagram, the cycle equivalent behavioral specification is derived. Once the cycle equivalent behavioral specification has been derived, the cycle equivalent behavioral specification is input to the process of preparing a simulation of a cycle-based logic design to run on a cycle-based simulation system as described in FIG. 2 above.

For example, Code Sample 1 is a behavioral specification in accordance with one or more embodiments of the invention.

| Code Sample 1: | |
|---|---|
| 1 | always @ (clock1) begin |
| 2 | output = A & B; |
| 3 | if(A) |
| 4 | @ clock2; $callpli; |
| 5 | else |
| 6 | sense = catch | miss; |
| 7 | @ clock1 |
| 8 | refresh = !busy & cached; |
| 9 | end |

Lines 1–9 of Code Sample 1 define a behavioral specification. Line 1 contains an "always" block distinguishing the behavioral specification as a class I specification.

Figure 4:
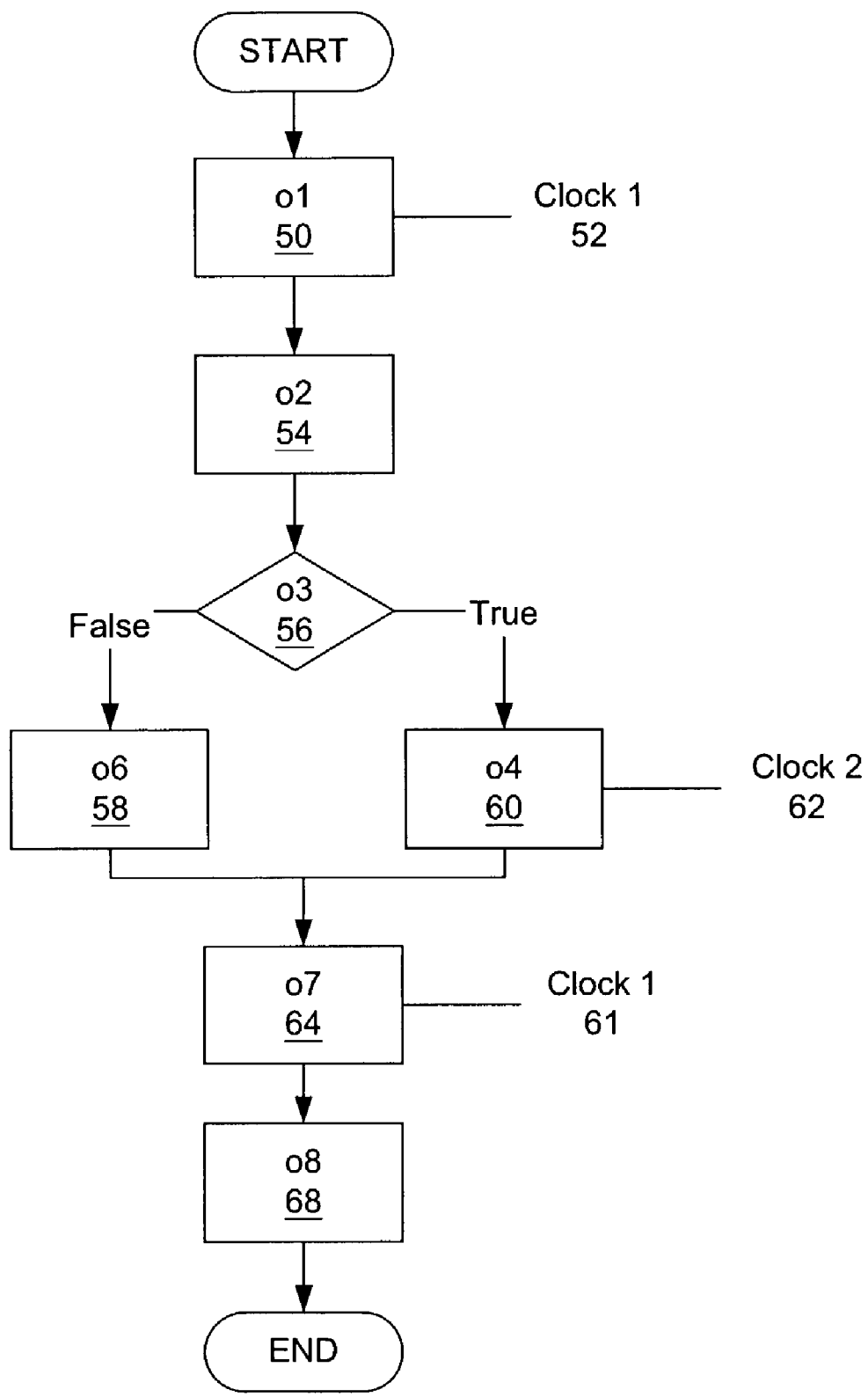
FIG. 4 shows a diagram representation of a circuit with multiple cycles within a procedural block in accordance with one or more embodiments of the invention.

FIG. 4 shows an example of a diagram representation derived from the Code Sample 1. Each of the nodes (50, 54, 56, 58, 60, 64, 68) represents a line from the behavioral specification. The statements o1 (50) and o2 (54) are executed in the first cycle of clock 1 (52) as derived from lines 1 and 2 of Code Sample 1. The conditional statement o3 (56) found in line 3 of Code Sample 1 is executed and depending on the output, statement o6 (58) or o4 (60) is executed (as derived from lines 4 and 6 of Code Sample 1, respectively). Statement o4 (60) is executed on the first cycle of clock 2 (62). On the next clock cycle, statement o7 (64) and o8 (68) that are derived from lines 8 and 9 of Code Sample 1 are executed in the second cycle of clock 1 (61).

Figure 5:
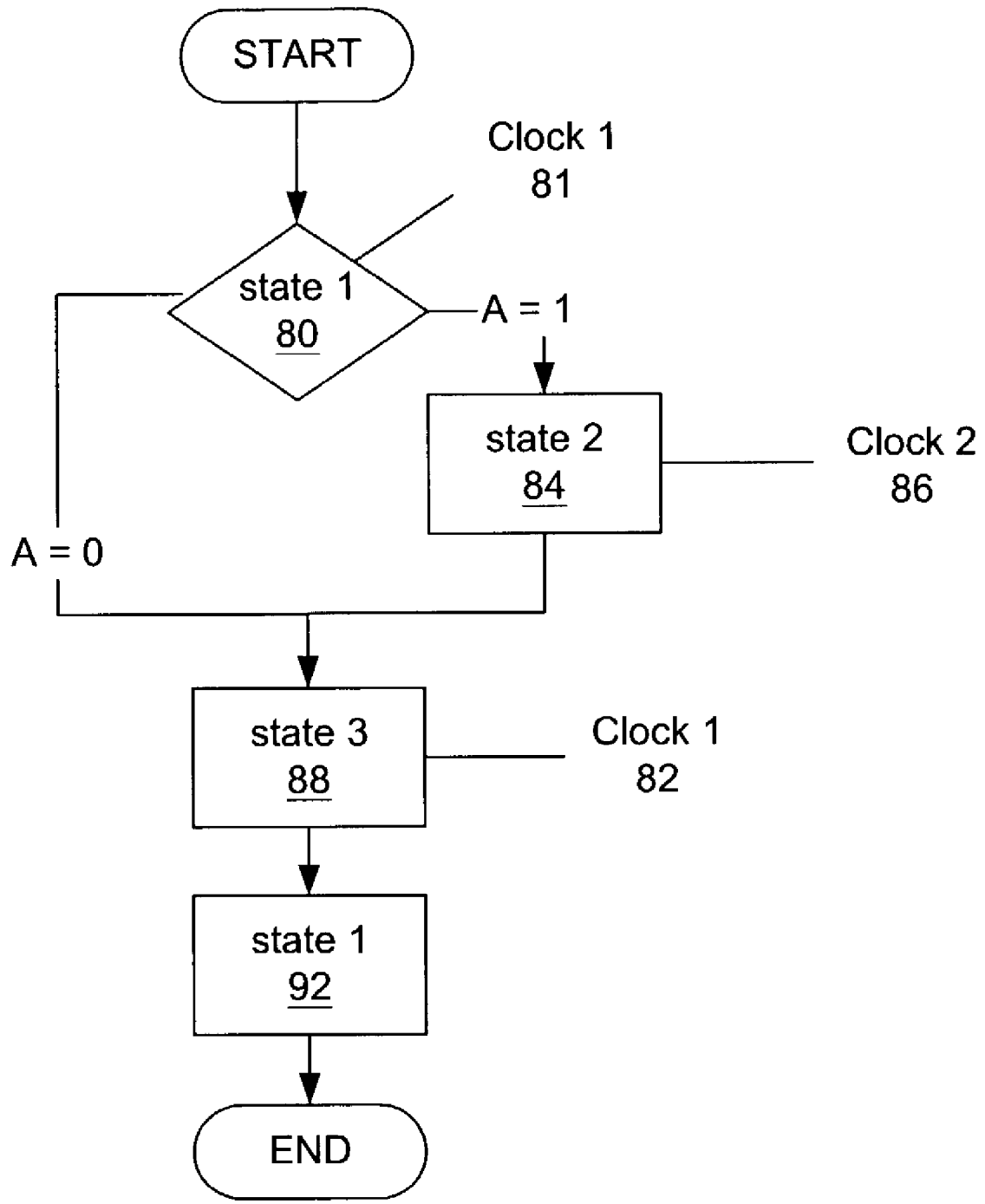
FIG. 5 shows a cycle diagram of a circuit with multiple cycles within a procedural block in accordance with one or more embodiments of the invention.

In FIG. 5, the compliant cycle diagram shows states with the cycle boundaries clearly defined in accordance with one or more embodiments of the invention. The compliant cycle diagram is derived by transforming the diagram representation as described in FIG. 3. Each state represents a state of a circuit (as described by the behavioral specification) at a cycle boundary. State 3 (88) can be reached from state 1 (80) via the left path without a clock edge. Another route to reach state 3 (88) is via the right path at which clock 2 (86) needs to advance to go from state 2 (84) to state 3 (88). Then, state 3 (88) advances to state 1 (91). Using the compliant cycle diagram, the cycle equivalent behavioral specification is derived.

Code Sample 2 is an example of a cycle equivalent behavioral specification derived from using the compliant cycle diagram in FIG. 4 and the original behavioral specification, namely Code Sample 1.

```
Code Sample 2:
1    always @ clock1 begin
2      case (state) begin
3        state1: begin
4          output = A & B;
5          if(A)
6            state = state2;
7          else begin
8            sense = catch | miss;
9            state = state3;
10         end
11       end
12       state3: begin
13         refresh = !busy & cached;
14         state = state1;
15       end
16     endcase
17   end
18
19   always @ clock2 begin
20     case (state) begin
21       state2: begin
22         $callpli
23         state = state3;
24       end
25     endcase
26   end
```

Lines 1–17 define a cycle equivalent behavioral specification. The "always" statements are cycle-based compliant.

In another example, in accordance with one or more embodiments of the invention, Code Sample 3 shows an example of a class I specification involving an "initial" block.

```
Code Sample 3:
1    initial begin
2      st1;
3      if(A)
4        @ clk2;
5      else
6        st2;
7      @ clk1
8      st3
9
10   end //initial
```

Lines 1–9 of Code Sample 3 define the behavioral specification. Line 1 contains an "initial" statement distinguishing the behavioral specification as a class I specification.

Figure 6:
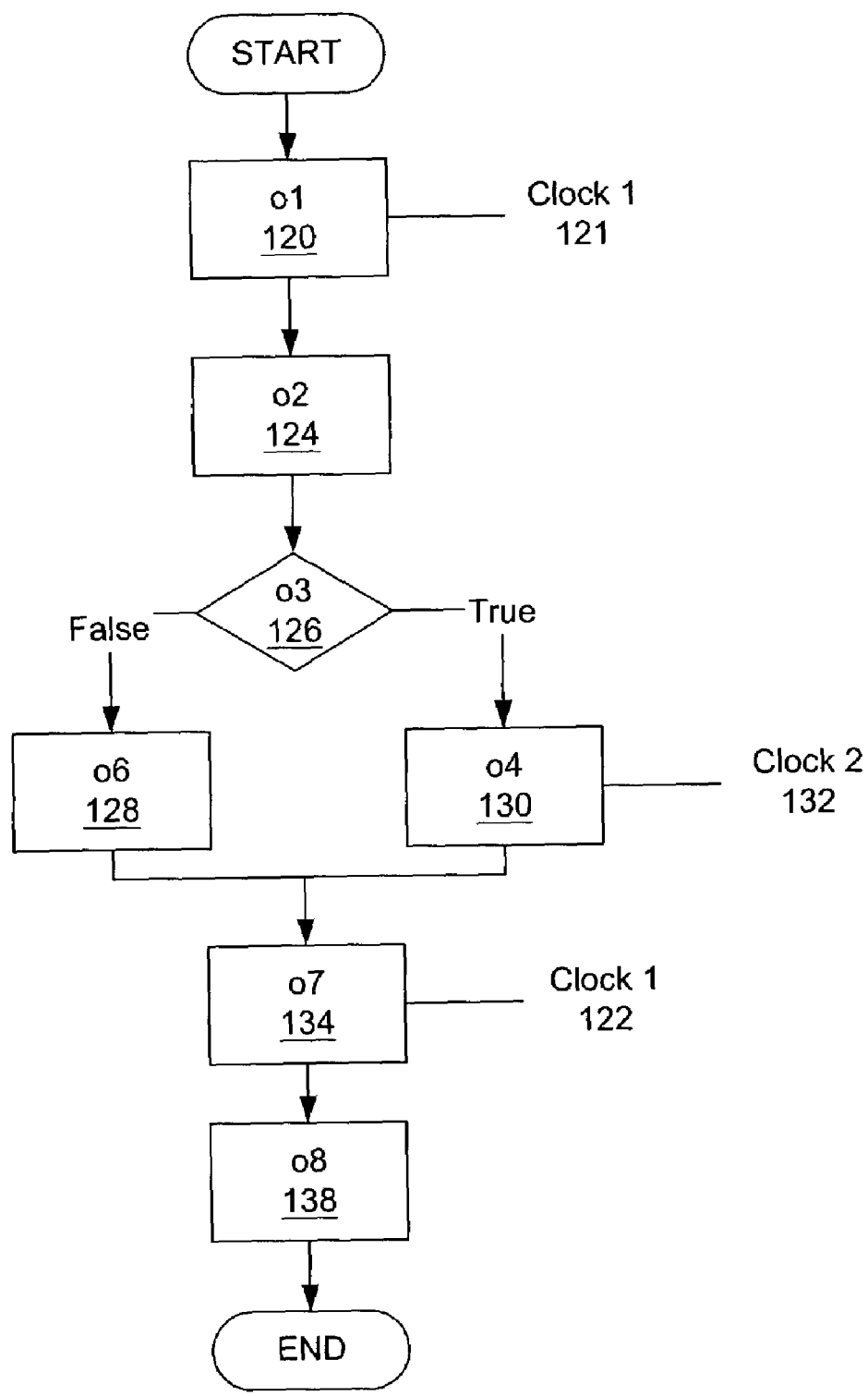
FIG. 6 shows a diagram representation of a circuit with multiple cycles within an initial block in accordance with one or more embodiments of the invention.

FIG. 6 shows an example of a representation diagram derived from Code Sample 3. The statements o1 (120) and o2 (124) found in lines 1 and 2 of Code Sample 3 respectively are executed in the first cycle of clock 1 (121). The conditional statement o3 (126) derived from line 3 of Code Sample 3 is executed. Depending on the output of executing the conditional statement, statement o6 (128) or o4 (130) is executed in first cycle of clock 2 (132). On the next clock cycle, statement o7 (134) and o8 (138) are executed in the second cycle of clock 1 (122).

Figure 7:
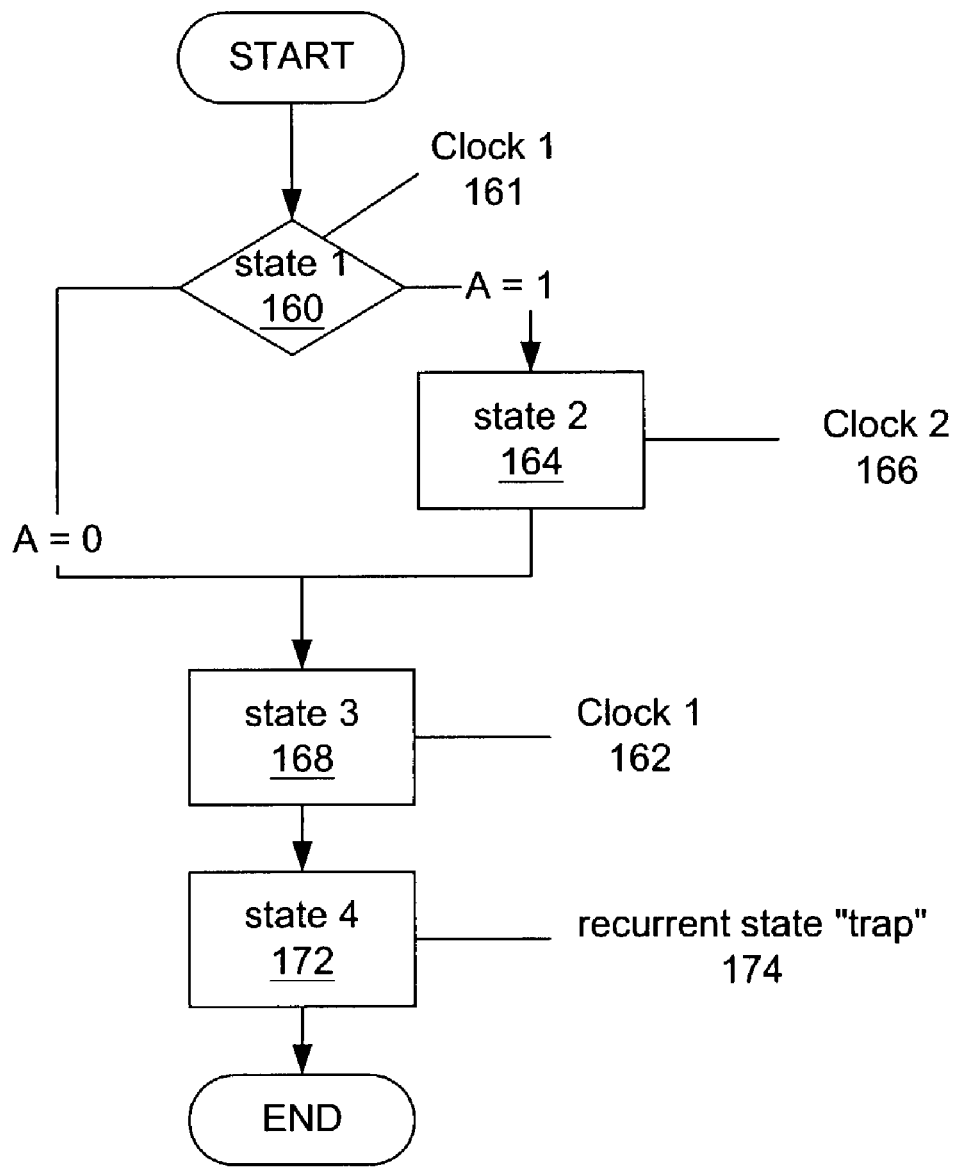
FIG. 7 shows a cycle diagram of a circuit with multiple cycles within an initial block in accordance with one or more embodiments of the invention.

In FIG. 7, the compliant cycle diagram shows states with the cycle boundaries clearly defined in accordance with one or more embodiments of the invention. The compliant cycle diagram is derived by transforming the diagram representation as described in FIG. 3. Each state represents a state of the circuit (as defined by the behavioral specification) at a cycle boundary. State 4 (172) can be reached from state 1 (160) via the left path at which clock 1 (161) needs to advance to go from state 3 (168) to state 4 (172). Another route to reach state 4 (172) is via the right path at which clock 2 (166) needs to advance to go from state 2 (164) to state 3 (168). Then, clock 1 (162) needs to advance in order to go from state 3 (168) to state 4 (172). The difference between this example and the class I specification with the "always" block is that in this case, no return is made to the original starting state. State 4 (172) is a recurrent dead state. Using the compliant cycle diagram, the cycle equivalent behavioral specification is derived.

Code Sample 4 is an example of a cycle equivalent behavioral specification derived from using the compliant cycle diagram in FIG. 7 and the original behavioral specification, namely Code Sample 3.

```
Code Sample 4:
1    initial begin
2      st1;
3      if(~A) st2;
4      state = state1;
5    end
6
7    always @ clk1 begin
8      case (state) begin
9        state1 or state2:
10         st3;
11         state = state3
12       default:
13     endcase
14   end
15
16   always @ clk2 begin
17     case (state) begin
18       state1: if(A) begin
19         st4;
20         state = state2;
21       end
22       default:
23     endcase
24   end
```

Lines 1–22 define a cycle equivalent behavioral specification. The "initial" statement is cycle based compliant.

In another example, in accordance with one or more embodiments of the invention, Code Sample 5 shows an example of a Class II type behavioral specification involving delays.

```
Code Sample 5:
initial begin
statement1;
#10
statement2;
#10
```

-continued

Code Sample 5:

```
statement3;
@clk
statement4;
end
```

Lines 1–9 of Code Sample 5 define the behavioral specification. Line 3 contains an "#10" statement distinguishing the behavioral specification with a delay as a class II specification.

Figure 8:
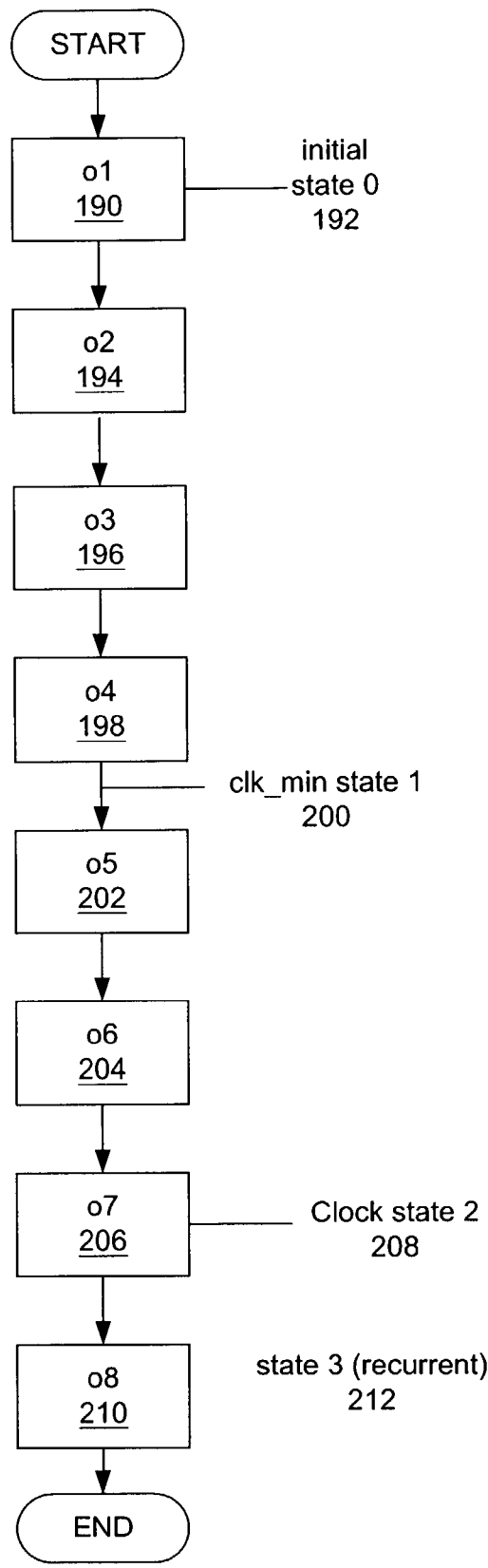
FIG. 8 shows a diagram representation of a circuit with cycle delays in accordance with one or more embodiments of the invention.

FIG. 8 shows an example of a representation diagram derived from Code Sample 5. The diagram representation with a delay in accordance to one or more embodiments of the invention is shown in FIG. 8. The statements o2 (194), o3 (196), and o4 (198) are executed in the first cycle of clock min (200) found in lines 2–4 of Code Sample 5, respectively. Statement o5 (202) and o6 (204) derived from lines 5 and 6 of Code Sample 5 are executed in the following cycle of clock min (200). Statement 8 (210) from line 8 of Code Sample 5 is executed at the next clock edge of clock after clock min (200). Using the diagram representation, all delays can be eliminated and the diagram representation can be converted to an equivalent class I specification.

Figure 9:
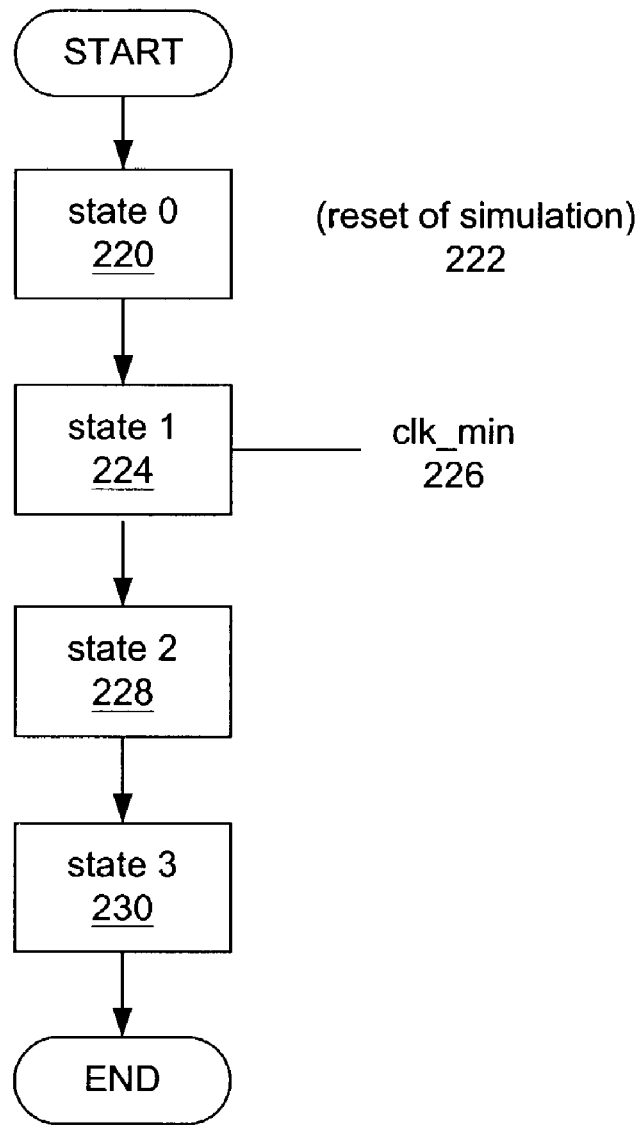
FIG. 9 shows a cycle diagram of a circuit with cycle delays in accordance with one or more embodiments of the invention.

FIG. 9, in accordance with one or more embodiments of the invention is the equivalent cycle diagram representation. The delays are transformed into a number of "@clock" statements using the techniques stated in FIG. 3. The compliant cycle diagram is derived by transforming the diagram representation as described in FIG. 3. Each state represents a state of the circuit (as defined by the behavioral specification) at a cycle boundary. After a reset of simulation (222), State 0 (220) is reached. At clk_mm (226) state 0 (220) advances to state 1 (224), then to state 2 (228), and then to state 3 (230) corresponding to the number of delays replaced by the "@clock" statements. Using the compliant cycle diagram, the cycle equivalent behavioral specification is derived. The cycle equivalent behavioral specification is ready to be simulated in a cycle-based simulator.

Code Sample 6 is an example of a cycle equivalent behavioral specification derived from using the compliant cycle diagram in FIG. 9 and the original behavioral specification, namely Code Sample 5.

Code Sample 6:

```
1    initial begin
2        statement1;
3        statement2;
4        state = state1
5    end
6
7    always@(clk_min)
8        case (state)
9        state1: begin
10           statement3;
11           state = state2;
12       end
13       default:
14       endcase
15
16   always@(clk)
17       case (state)
18       state2: begin
19           statement4;
20           state = state3;
```

-continued

Code Sample 6:

```
21       end
22       default:
23       endcase
24   end
```

Lines 1–22 define a cycle equivalent behavioral specification. The "initial" statement is cycle-based compliant.

Advantages of the invention may include one or more of the following. The invention makes possible for a hybrid system or a behavioral model to be simulated in a cycle-based simulator thereby increasing the scope of utility and productivity of Verilog. The invention also decreases the simulation time by using cycle based testing. Further, the invention provides an automatic translation from event-based simulation to cycle-based simulation. Further, the invention allows previously created behavioral model produced for event-driven simulation to be transformed and capable of being run on a cycle-based simulator. Those skilled in the art will appreciate that the invention may have further advantages.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A method for transforming a behavioral specification of a circuit, comprising:
converting the behavioral specification into a diagram representation, wherein each statement in the behavioral specification is represented in the diagram representation by at least one selected from the group consisting of a node, a decision box, and a connection;
converting a delay from the diagram representation if the behavioral specification comprises a delay, wherein the delay is a delay statement in the behavioral specification;
generating a compliant cycle diagram from the diagram representation;
storing the compliant cycle diagram on tangible memory;
deriving a cycle equivalent behavioral specification from the compliant cycle diagram.

2. The method of claim 1, further comprising:
verifying the cycle equivalent behavioral specification using a cycle-based simulation system.

3. The method of claim 2, further comprising:
generating a cycle-based compliant circuit design using the cycle equivalent behavioral specification, if verified.

4. The method of claim 1, wherein the behavioral specification comprises multiple cycles within a procedural block.

5. The method of claim 1, wherein the behavioral specification comprises multiple cycles within an initial block.

6. The method of claim 1, wherein the behavioral specification comprises a cycle delay.

7. The method of claim 1, wherein converting the delay comprises converting the delay to an equivalent number of clock cycles.

8. A computer system to transform a behavioral specification of a circuit, comprising:

a processor;

a memory; and software instructions stored in the memory for enabling the computer system under control of the processor, to perform:

converting the behavioral specification into a diagram representation, wherein each statement in the behavioral specification is represented in the diagram representation by at least one selected from the group consisting of a node, a decision box, and a connection;

converting a delay from the diagram representation if the behavioral specification comprises a delay, wherein the delay is a delay statement in the behavioral specification;

generating a compliant cycle diagram from the diagram representation; and deriving a cycle equivalent behavioral specification from the compliant cycle diagram.

9. The computer system of claim 8, wherein the behavioral specification comprises multiple cycles within a procedural block.

10. The computer system of claim 8, wherein the behavioral specification comprises multiple cycles within an initial block.

11. The computer system of claim 8, wherein the behavioral specification comprises a cycle delay.

12. The computer system of claim 8, wherein converting the delay comprises converting the delay to an equivalent number of clock cycles.

13. A computer-readable medium having recorded thereon a plurality of instructions executable by a processor, comprising the plurality of instructions for transforming a behavioral specification of a circuit by:

converting the behavioral specification into a diagram representation, wherein each statement in the behavioral specification is represented in the diagram representation by at least one selected from the group consisting of a node, a decision box, and a connection;

converting a delay from the diagram representation if the behavioral specification comprises a delay, wherein the delay is a delay statement in the behavioral specification;

generating a compliant cycle diagram from the diagram representation; storing the compliant cycle diagram on tangible memory;

deriving a cycle equivalent behavioral specification from the compliant cycle diagram.

14. The computer-readable medium of claim 13, wherein the behavioral specification comprises multiple cycle within a procedural block.

15. The computer-readable medium of claim 13, wherein the behavioral specification comprises multiple cycles within an initial block.

16. The computer-readable medium of claim 13, wherein the behavioral specification comprises a cycle delay.

17. The computer-readable medium of claim 13, wherein converting the delay comprises converting the delay to an equivalent number of clock cycles.

18. An apparatus for transforming a behavioral specification of a circuit, comprising:

means for converting the behavioral specification into a diagram representation, wherein each statement in the behavioral specification is represented in the diagram representation by at least one selected from the group consisting of a node, a decision box, and a connection;

means for converting a delay from the diagram representation if the behavioral specification comprises a delay, wherein the delay is a delay statement in the behavioral specification;

means for generating a compliant cycle diagram from the diagram representation; and means for deriving a cycle equivalent behavioral specification from the compliant cycle diagram.

* * * * *